United States Patent
Bernard et al.

(10) Patent No.: US 7,350,544 B2
(45) Date of Patent: Apr. 1, 2008

(54) STATION FOR CONTROLLING AND PURGING A MINI-ENVIRONMENT

(75) Inventors: Roland Bernard, Vuiz-la-Chiesaz (FR); Hisanori Kambara, Villy-le-Pelloux (FR); Amaud Favre, Annecy (FR)

(73) Assignee: Alcatel, Paris (FR)

( * ) Notice: Subject to any disclaimer, the term of this patent is extended or adjusted under 35 U.S.C. 154(b) by 355 days.

(21) Appl. No.: 11/035,996

(22) Filed: Jan. 18, 2005

(65) Prior Publication Data

US 2005/0160705 A1    Jul. 28, 2005

(30) Foreign Application Priority Data

Jan. 20, 2004    (FR)    .................... 04 50101

(51) Int. Cl.
*B65B 1/04*    (2006.01)
(52) U.S. Cl. .............. 141/89; 141/4; 141/11; 141/65; 141/85; 414/217.1
(58) Field of Classification Search .............. 141/4–8, 141/11, 59, 65, 67, 83, 85, 89, 94, 98; 414/217.1; 55/385.1
See application file for complete search history.

(56) References Cited

U.S. PATENT DOCUMENTS 5,346,518 A * 9/1994 Baseman et al. ............. 96/126
5,391,035 A * 2/1995 Krueger .................... 414/217.1
5,829,939 A * 11/1998 Iwai et al. ................... 414/411
6,637,998 B2 * 10/2003 Langan et al. .............. 414/217
6,758,876 B2 * 7/2004 Suzuki et al. .............. 55/385.6
6,883,539 B2 * 4/2005 Inoue et al. ........... 137/565.23

FOREIGN PATENT DOCUMENTS

| EP | 0 151 336 A2 | 8/1985 |
| EP | 0 778 359 A1 | 6/1997 |
| WO | WO 98/11598 A1 | 3/1998 |

\* cited by examiner

*Primary Examiner*—Timothy L. Maust
(74) *Attorney, Agent, or Firm*—Sughrue Mion, PLLC (57) ABSTRACT

A SMIF type mini-environment (1) can be connected onto a purge station (2). The purge station comprises a leaktight purge compartment (2b) whose top face includes a closable transfer passage (2c) facing the bottom face (1b) of the mini-environment pod (1). An elevator (4) is suitable for vertically displacing the bottom wall (1b) of the mini-environment pod (1) when coupled thereto, simultaneously moving the stack (3) of substrate wafers carried by the bottom wall (1c) so as to introduce them together into the leaktight purge compartment (2b). The stack (3) of substrate wafers is then purged inside a leaktight purge compartment (2b) of the purge station (2), while simultaneously purging the mini-environment pod (1). This provides purging that is much more effective and much faster, thus encouraging the use of SMIF mini-environment pods in microelectronic processes.

20 Claims, 7 Drawing Sheets

STATION FOR CONTROLLING AND PURGING A MINI-ENVIRONMENT

The present invention relates to devices and processes for reducing contamination of semiconductor substrate wafers during semiconductor fabrication in a clean room.

The invention relates more particularly to devices and processes in which mini-environment pods, i.e. modular isolating boxes, are used for storing and transporting semiconductor substrate wafers between the various steps in processes for fabricating semiconductors and micro-electromechanical systems (MEMS).

Semiconductors and MEMS are conventionally fabricated in clean rooms containing an atmosphere that is controlled to have a very low contamination content. Nevertheless, implementing ever denser integration of semiconductor circuits requires individual circuits to be made of ever smaller sizes. Typically, the integrated circuits that are being produced industrially at present thus include sizes that are of the order of 0.13 micrometers ($\mu$m). Unfortunately, the content of volatile contamination present in clean rooms interferes in perceptible manner with the 0.13 $\mu$m sizes of such integrated circuits. It thus becomes necessary during fabrication to maintain semiconductor substrate wafers in atmospheres that are free from volatile contamination, or that contain volatile contamination in infinitesimal quantities, and this is a trend that is going to continue in the future with ever increasing requirements for integration.

Unfortunately, it is difficult an expensive to maintain an volatile contamination content that is infinitesimal in an atmosphere of large volume, such as the atmosphere of a clean room.

To solve the difficulty associated with the presence of still-excessive contamination in clean rooms, and in order to avoid the corresponding cost, proposals have already been made to place semiconductor substrate wafers or masks in mini-environment pods in order to protect them from the residual pollution that is still present in a clean room. Thus, U.S. Pat. Nos. 4,532,970 and 4,534,389 describe standard mechanical interfaces (SMIFs) enabling stacks of semiconductor substrate wafers having a diameter of 200 millimeters (mm) to be transported. The pod having a standard interface has a leakproof peripheral wall provided with a closable bottom access passage for inserting and removing a stack of semiconductor substrate wafers. The stack of semiconductor substrate wafers is secured to the bottom wall, the wall and the stack being moved together during insertion and withdrawal.

At present, stacks of wafers having a diameter of 300 mm are also transported in mini-environment pods having a standardized front opening, known as front-opening unified pods (FOUPs).

Sometimes, use is also made of mini-environment pods adapted for transporting a single substrate wafer.

Semiconductor substrate wafers, or other substrates, typically remain for several weeks in the semiconductor fabrication unit between the various process steps. During this time, the semiconductor substrate wafers are transported in the mini-environment pods.

In processes of fabricating semiconductors, integrated circuits, and micro-electromechanical systems, there exist numerous sources of substrate contamination, and such contamination represents the main cause for loss of yield in component fabrication. It is considered that in general there are two types of contamination: contamination by particles, and contamination by molecules, also known as volatile contamination.

A particle is a stable or quasi-stable agglomeration of molecules having dimensions that may be as small as a few nanometers (nm). An aerosol particle is a particle suspended in ambient air or gas and having a displacement speed that is slower than some arbitrary speed. A molecular contaminant is a contaminant that is not classified as being a particle or an agglomeration of particles, and it may comprise a single molecule, a small collection of molecules, or a film. There are also corrosive gases that are present in the mini-environment, coming from the process chamber during the transfer of substrates or while certain components are degassing or while chemical reactions are taking place in the mini-environment pod. The presence of humidity encourages organic contamination that affects the quality of oxide layers and performs unwanted doping. Most contamination takes place between process steps while the substrates are waiting for the following steps.

To reduce the presence of sources of contamination in the mini-environment pod, proposals have already been made to purge the atmosphere inside the mini-environment pod, as described in U.S. Pat. No. 5,988,233. For this purpose, the mini-environment pod is fitted with an inlet and an outlet for gas, a non-corrosive gas is introduced in order to replace the corrosive gas such as air that is present inside the pod. Nitrogen is generally used as the purge gas in order to neutralize the mini-environment pod.

Nevertheless, it is found that purging the mini-environment pod is generally not sufficient, and non-negligible sources of pollution remain inside the mini-environment pod and continue to lower the fabrication yield of semiconductors, integrated circuits, and other components.

It is also found that purging the mini-environment pod is an operation that is relatively lengthy, monopolizing the means for generating the purge gas for a non-negligible length of time, thereby reducing the overall efficiency of the installation. As a general rule, purging a mini-environment pod by such a technique requires a duration of several tens of minutes (min) and the result is still not satisfactory.

In addition, presently-known purging is not performed on standard mini-environments.

It turns out to be particularly difficult to purge a mini-environment pod completely, and in particular to purge the interstices between substrate wafers stacked one above the other inside the mini-environment pod.

The inventors have carried out a study, in particular by stimulation, from which they have discovered that with a stack of superposed substrate wafers separated from one another by gaps,)the purge gas does not become distributed properly over the entire surface of each substrate wafer, thereby leading to active surface zones that are not purged effectively, where volatile contamination can stagnate.

The problem proposed by the present invention is to avoid the drawbacks of prior art systems, in particular by enabling the sources of pollution present in a mini-environment pod to be reduced significantly further, so as to reduce the risk of contamination to substrate wafers placed in mini-environment pods during processes for fabricating micro-electronic components or micro-electromechanical systems. It is desired in particular to reduce volatile contamination.

To do this, the invention seeks to improve purging conditions significantly so as to avoid dead zones appearing in which purging is insufficient.

The invention also seeks to accelerate purging significantly, so as to reduce the length of time needed during which the purge installation is dedicated to purging a single mini-environment pod.

The invention seeks simultaneously to improve purging conditions without any corresponding increase in the purge gas flow, so as to avoid any violent gas streams, which can themselves constitute sources of contamination and degradation to the surfaces of the substrates being treated.

The invention also seeks to ensure that purging is performed in satisfactory manner while conserving the known structure of standard mini-environments.

The invention is based on the idea of performing purging while the mini-environment pod is in the open state, with the stack of substrate wafers being situated outside the mini-environment pod, but in an atmosphere that is controlled.

Thus, to achieve these objects and others, the invention provides a device for controlling and reducing contamination of a stack of disjoint substrate wafers placed in a mini-environment pod, the device comprising said mini-environment pod having a leakproof peripheral wall provided with a closable access passage for introducing and withdrawing the stack of substrate wafers, the device being characterized in that it further comprises a purge station in combination with said pods, said purge station comprising:

a leaktight purge compartment dimensioned to receive and contain the stack of disjoint substrate wafers;

a closable transfer passage and means for selective leaktight coupling of the closable access passage of the mini-environment pod with the closable transfer passage;

handler means for moving the stack of substrate wafers between the mini-environment pod and the leaktight purge compartment;

diffuser means adapted to diffuse a purge gas laterally towards the edges of the wafers in the stack parallel to their main faces; and collector means disposed to collect the diffused flow of purge gas remote from the diffuser means after passing between the wafers of the stack.

It will be understood that the inside of the mini-environment pod is purged by gas penetrating and exiting via the closable access passage, which is then in the open state, and simultaneously the interstices between the substrate wafers are purged inside the leaktight purge compartment of the purge station by means which ensure particularly effective diffusion and distribution of the purge gas.

In an advantageous embodiment, the diffuser means comprise one or more distributor columns having respective continuous longitudinal slots of width appropriate for passing the purge gas radially, e.g. width equal to about 1 mm.

Alternatively, the diffuser means comprise one or more distributor columns each having a series of holes distributed along a generator line of the distributor column.

In another advantageous option, the diffuser means comprise a rectangular vertical grid placed laterally facing the stack of substrate wafers.

With such a device, it can be estimated that purging of satisfactory quality is obtained after purging for a duration of about 5 min.

Preferably, the leaktight purge compartment includes a bottom reserve volume occupying the space beneath the stack of disjoint substrate wafers while purging is taking place. This enables purging to be achieved more uniformly and more quickly, with the time required being reduced to less than 2 min.

In an advantageous embodiment, the invention applies to mini-environment pods of the type having a standardized mechanical interface (SMIF). In which case, the bottom wall closes the closable access passage and can be moved vertically carrying the stack of disjoint substrate wafers. Under such circumstances, the purge station includes a top face provided with a closable transfer passage and provided with leaktight coupling means for coupling around the access passage while allowing the bottom wall of the mini-environment pod to move vertically into the inside of the leaktight purge compartment. The handler means comprise an elevator housed in the leaktight purge compartment and adapted to support the bottom wall of the mini-environment pod and the stack of disjoint substrate wafers, and to move them between the mini-environment pod and the leaktight purge compartment.

Preferably, the purge station further comprises a purge gas treatment device connected to the inside space of the leaktight purge compartment in order to collect the purge gases.

Good results are obtained by providing for the purge gas treatment device to be connected:

to the collector device to receive the purge gas after it has passed between the wafers of the stack;

to the bottom reserve volume to receive the gas confined in the bottom reserve volume; and to the top zone of the leaktight purge compartment in the vicinity of the closable transfer passage.

It is advantageous to suck the purge gas out from the leakproof purge compartments in order to exhaust it via an exhaust pipe.

For this purpose, a first technique consists in providing specific pump means that suck the purge gas out from the leakproof purge compartment and that deliver it to the exhaust pipe.

However, it is preferable for the suction means to be constituted by the suction means that are provided for the clean room itself in which the device of the invention is located.

In which case, in a first embodiment, said exhaust pipe is connected to the suction pipe of the clean room.

In a preferred embodiment, the exhaust pipe delivers in non-sealed manner into the inlet of an outlet collector, said inlet itself being wide open to the clean room, and the outlet from the outlet collector being connected to the suction pipe of the clean room. This avoids applying suction to the purge volume, which would be harmful to the plastics wall of the mini-environment pod. This also enables the mini-environment pod itself to be purged simultaneously.

The inside atmosphere and the quality of purging are monitored by providing means for analyzing the pumped gases.

For example, the pumped gas analysis means may comprise gas analysis means and humidity sensors.

Given the type of volatile contamination that is to be eliminated, it is preferable for the pumped gas analysis means to comprise an ion mobility spectrometer (IMS).

Other objects, characteristics, and advantages of the present invention appear from the following description of particular embodiments, given with reference to the accompanying figures, in which:

Figure 1:
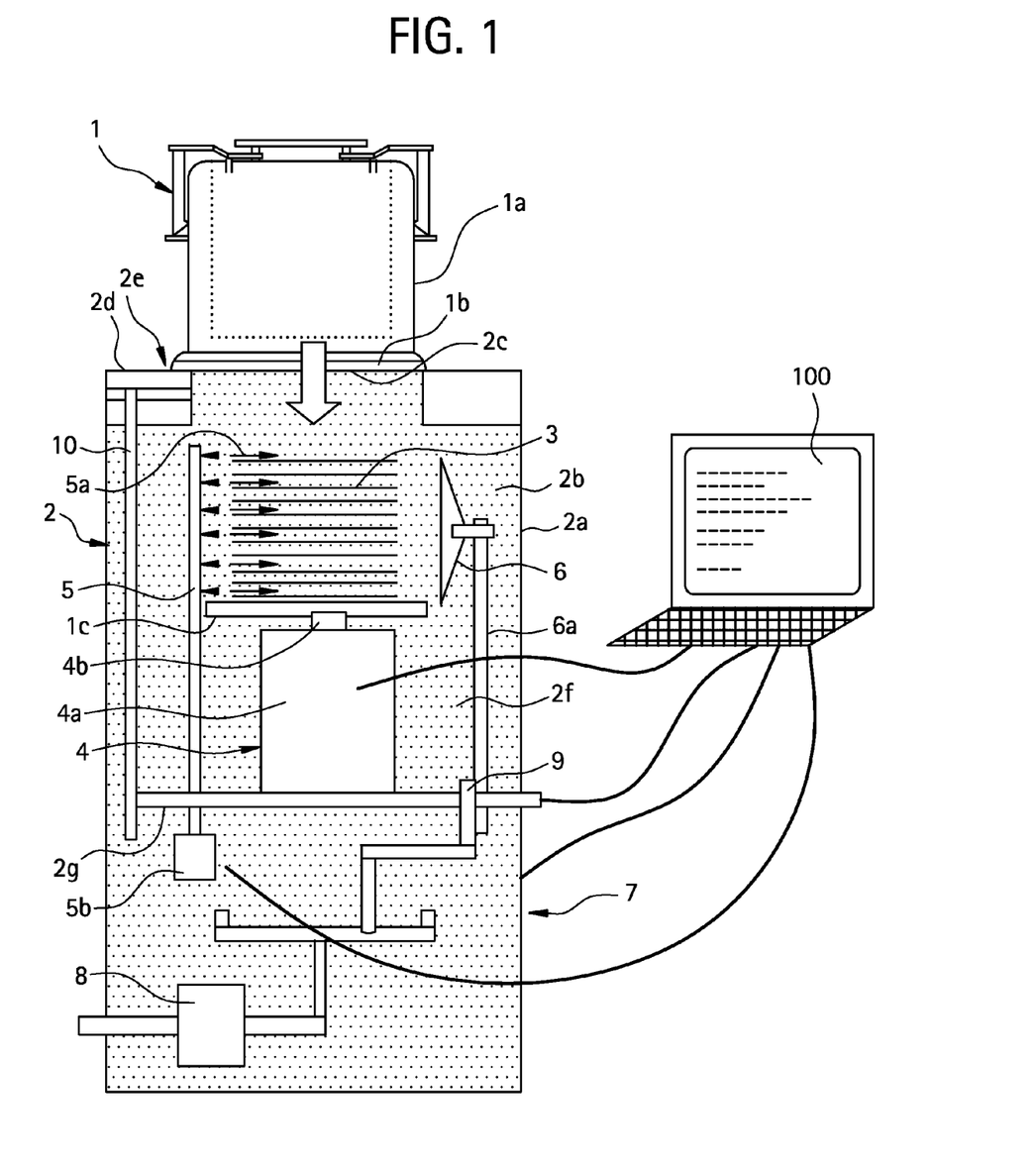
FIG. 1 is a diagram showing a mini-environment pod coupled to a purge station constituting an embodiment of the present invention.

In the embodiment shown diagrammatically in FIG. 1, the device of the invention is adapted to purging a mini-environment pod 1 of the SMIF type, having a leakproof peripheral wall 1a and a bottom access passage 1b that is closable by means of a bottom wall 1c.

The device comprises a purge station 2 having a leakproof peripheral wall 2a for defining a leakproof purge compartment 2b with a transfer passage 2c provided in the top face 2d, the transfer passage 2c likewise being closable by closure means that are not shown in the figure.

Leaktight coupler means 2e are provided around the access passage 2c for leaktight coupling of the mini-environment pod 1 around the access passage 2c, suitable for allowing the bottom wall 1c of the mini-environment pod 1 to move vertically into the inside of the leaktight purge compartment 2b.

A stack of disjoint substrate wafers 3 is placed on the bottom wall 1c of the mini-environment pod 1, said bottom wall 1c having horizontal dimensions greater than the dimensions of the substrate wafers in the stack 3.

As is conventional, the stack 3 of substrate wafers may be a cassette serving to hold the individual substrates apart from one another at a predefined spacing.

Handler means 4 serve to move the stack 3 of disjoint substrate wafers and the bottom wall 1c between the mini-environment pod 1 and the leaktight purge compartment 2b. In the example shown in FIG. 1, the handler means 4 comprise an elevator, represented by an actuator cylinder 4a and an actuator rod 4b acting vertically on the bottom wall 1c to move it towards and away from the access passage 2c. In a top limit position, the bottom wall 1c closes the mini-environment pod 1. In a bottom limit position as shown in FIG. 1, the bottom wall 1c and the stack 3 of substrate wafers lie entirely inside the leaktight purge compartment 2b, in order to perform the purging operation.

As can be seen, the leaktight purge compartment 2b has a horizontal size that is greater than the horizontal size of the substrate wafers that are to be treated, and a vertical size that is considerably greater than the vertical size of the stack 3 of substrate wafers to be treated. In the bottom limit position as shown in FIG. 1, the top of the stack 3 of substrate wafers is preferably situated well below the access passage 2c so as to leave the access passage 2c wide open in order to leave free passage for gas between the inside of the mini-environment pod 1 and the inside of the leaktight purge compartment 2b.

The leaktight purge compartment 2b preferably includes a bottom reserve volume 2f which occupies a space of sufficient height beneath the stack 3 of substrate wafers while purging is taking place.

For example, the bottom reserve volume 2f may be of a height that is substantially equal to the height of the stack 3 of substrate wafers, going down to a bottom leakproof wall 2g which closes the bottom of the leaktight purge compartment 2b.

Distributor means 5 are provided in the purge compartment 2b adapted to diffuse a purge gas laterally towards the edges of the substrate wafers and parallel to the main faces thereof, as represented by arrow 5a, for example.

Figure 6:
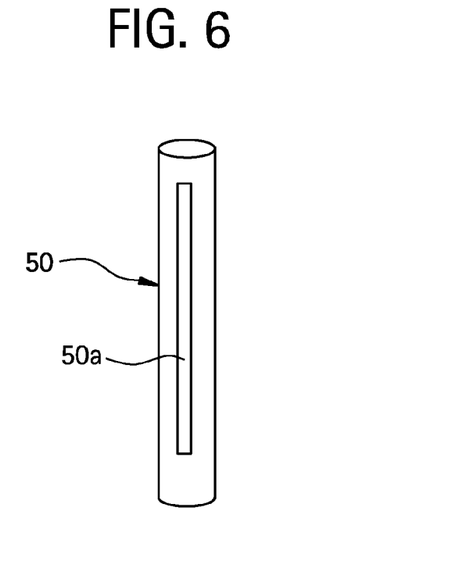
FIG. 6 shows distributor means constituting a first embodiment with a distributor column.

By way of example, the distributor means 5 may comprise one or more distributor columns 50 as shown in FIG. 6, each having a continuous longitudinal slot 50a of width equal to about 1 mm and facing towards the center of the stack 3 of substrate wafers to be treated, so as to allow the purge gas to pass through radially.

Figure 7:
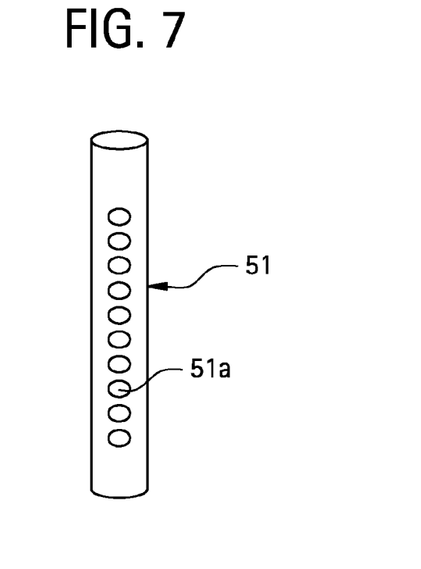
FIG. 7 shows distributor means constituting a second embodiment with a distributor column.

In another example, the distributor means 5 may be as shown in FIG. 7, comprising one or more distributor columns 51 each having a series of holes 51a distributed along a generator line of the distributor column 51 and facing towards the center of the stack 3 of substrate wafers.

Figure 8:
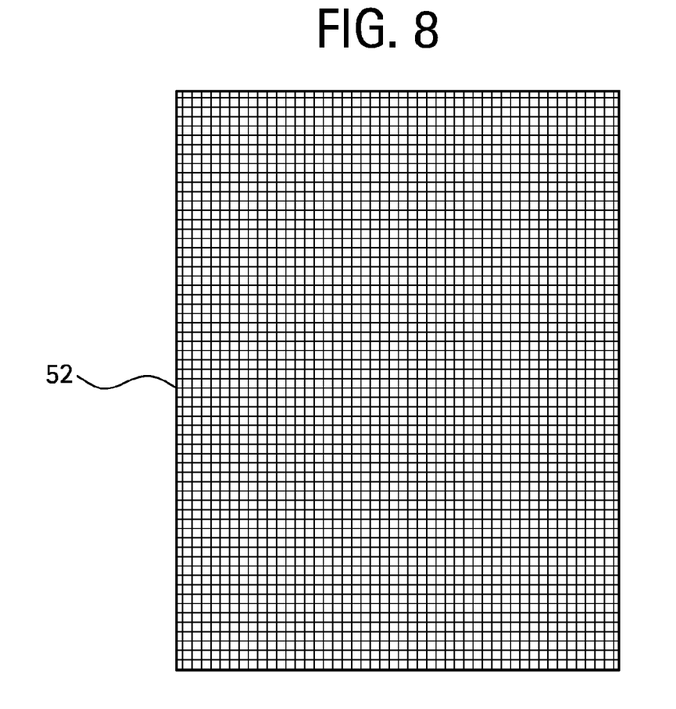
FIG. 8 shows distributor means constituting a third embodiment with a distribution grid.

In another example, as shown in FIG. 8, the distributor means 5 may comprise a rectangular vertical grid 52 placed on one side facing the stack 3 of substrate wafers. The grid presents a mesh of size appropriate for obtaining a regular distribution of purge gas flow towards the stack 3 of substrate wafers. For example, it is possible to use filter structures.

The height of the distributor means 5 may advantageously be slightly greater than the height of the stack 3 of substrate wafers to be treated. The structure of the distributor means 5 may advantageously be capable of creating a purge gas flow along the full height of the stack 3 of substrate wafers.

Returning to FIG. 1, collector means 6 are located opposite from the distributor means 5 for the purpose of collecting the diffused flow of purge gas after it has passed between the wafers of the stack 3.

The distributor means 5 ensure that the purge gas flows uniformly between the wafers of the stack 3, and escapes via the collector 6 in order to leave the leaktight purge compartment 2b.

The distributor means 5 are connected to a source 5b of purge gas. The purge gas may advantageously be nitrogen.

The collector means 6 may advantageously be connected via a pipe 6a to a purge gas treatment device 7, adapted to suck in the purge gas collected by the collector means 6.

The purge gas treatment device 7 shown in FIG. 1 includes, in particular, pump means 8 for pumping the purge gas, together with processor means that are not shown in FIG. 1.

The pump means 8 may advantageously be connected not only to the pipe 6a coming from the collector means 6, but also to a bottom orifice 9 inside the bottom reserve volume 2f, and also to the closable access passage 2c via a branch connection pipe 10.

The branch connection pipe 10 serves to suck in more quickly the gas coming from the mini-environment pod 1 when it is opened by lowering the bottom wall 1c, thereby limiting subsequent accumulation of said gas in the bottom reserve volume 2f. In this respect, it should be observed that the purge gas such as nitrogen is slightly lighter than the air that is to be purged, and therefore tends to rise into the mini-environment pod, while the air tends to move down into the leaktight purge compartment 2b to end up in the bottom reserve volume 2f.

A control device 100 such as a microcomputer or a microcontroller serves to control the members of the device such as the handler means 4, the pump means 8, and the purge gas source 5b, so as to implement purging under optimum conditions.

Figure 2:
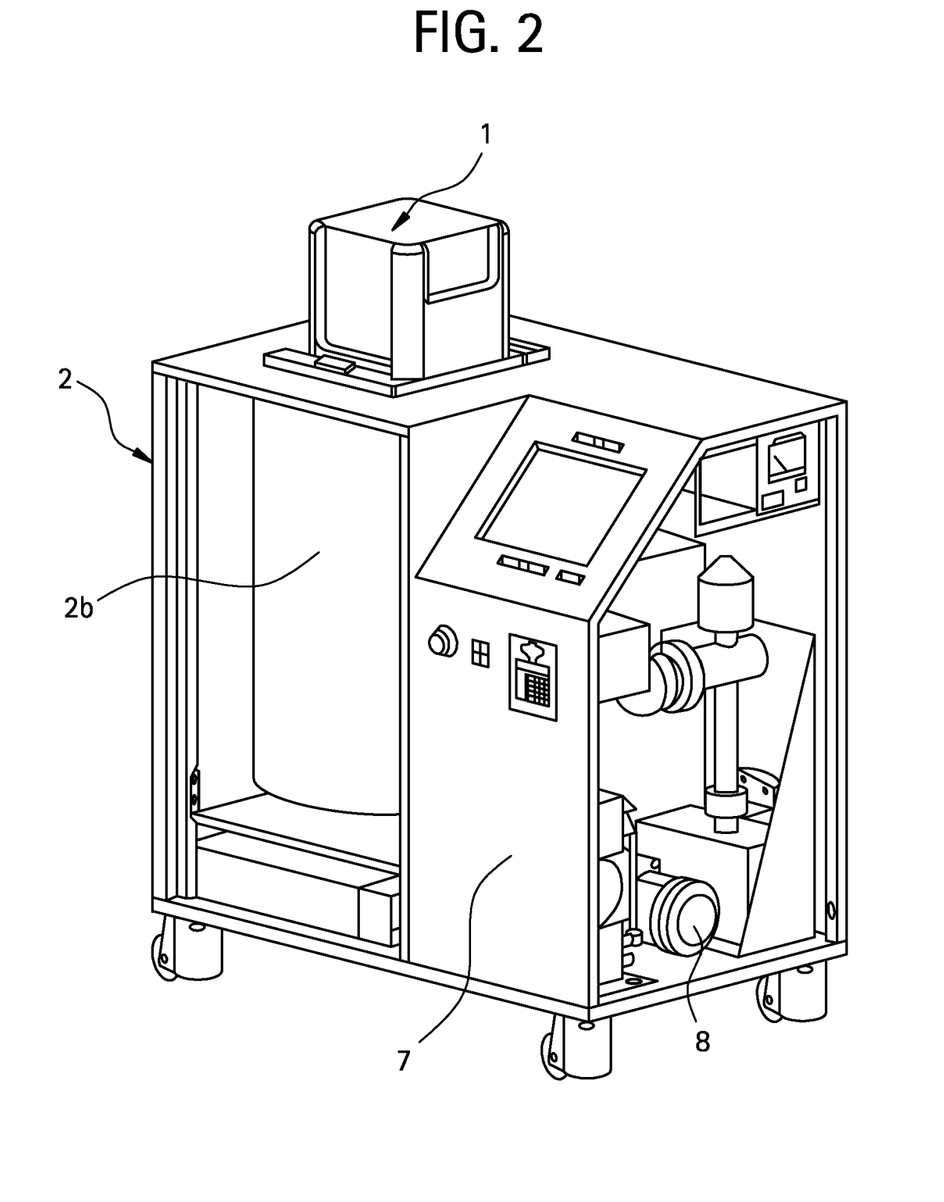
FIG. 2 is a perspective view showing the general structure of the FIG. 1 purge station system.

FIG. 2 shows the essential elements of the device, in particular the mini-environment pod 1, the purge station 2 with its leaktight purge compartment 2b, and the processor station 7 including its vacuum pump 8.

Figure 3:
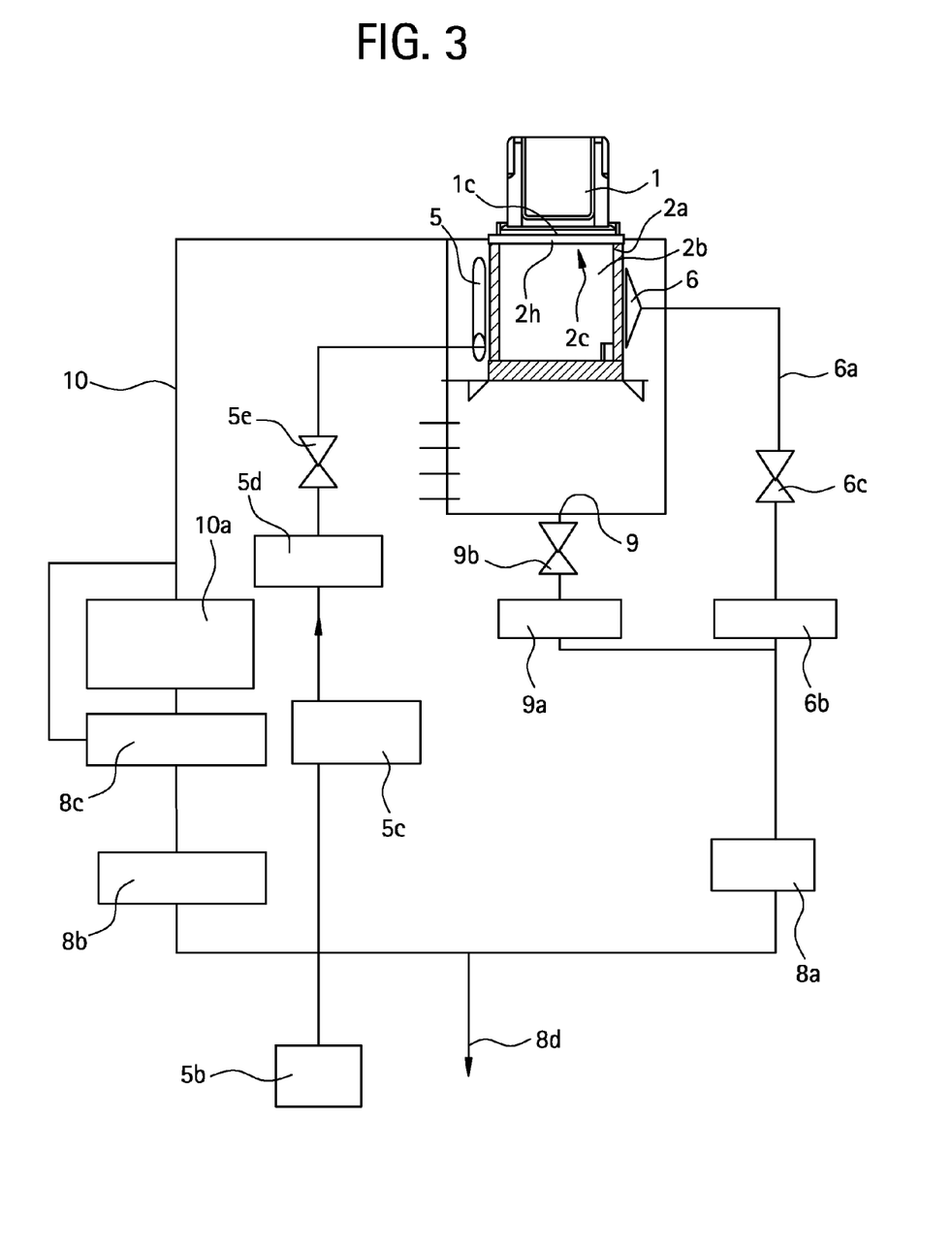
FIG. 3 shows the pump and treatment means associated with a purge station of FIG. 1 or 2, showing one particular embodiment for the pump means.

With reference to FIG. 3, there can still be seen the essential elements making up the mini-environment pod 1, the leaktight purge compartment 2b isolated by the peripheral wall 2a and having a transfer passage 2c closed by a moving plate 2h which comes into contact with the bottom wall 1c of the mini-environment pod 1. The plate 2h is carried by the handler means (not shown in this figure). There can also be seen the distributor means 5 and the collector means 6.

The purge gas source 5b is connected to the distributor means 5 via a filter and expander unit 5c followed by a flow rate regulator 5d and a stop valve 5e. The collector means 6 are connected to a first pump 8a via a constriction 6b in series in the pipe 6a and via a stop valve 6c. The same pump 8a is connected to the bottom orifice 9 via a second constriction 9a and a stop valve 9b.

A second pump 8b connected in series with a secondary pump 8c is connected via a capillary constituting the branch connection pipe 10 to a gas intake at the transfer passage 2c at the top portion of the leaktight purge compartment 2b.

In series in the branch connection pipe 10, it is advantageous to provide a gas analyzer 10a for analyzing the pumped gas.

The pumps 8a and 8b deliver into an exhaust pipe 8d.

Figure 4:
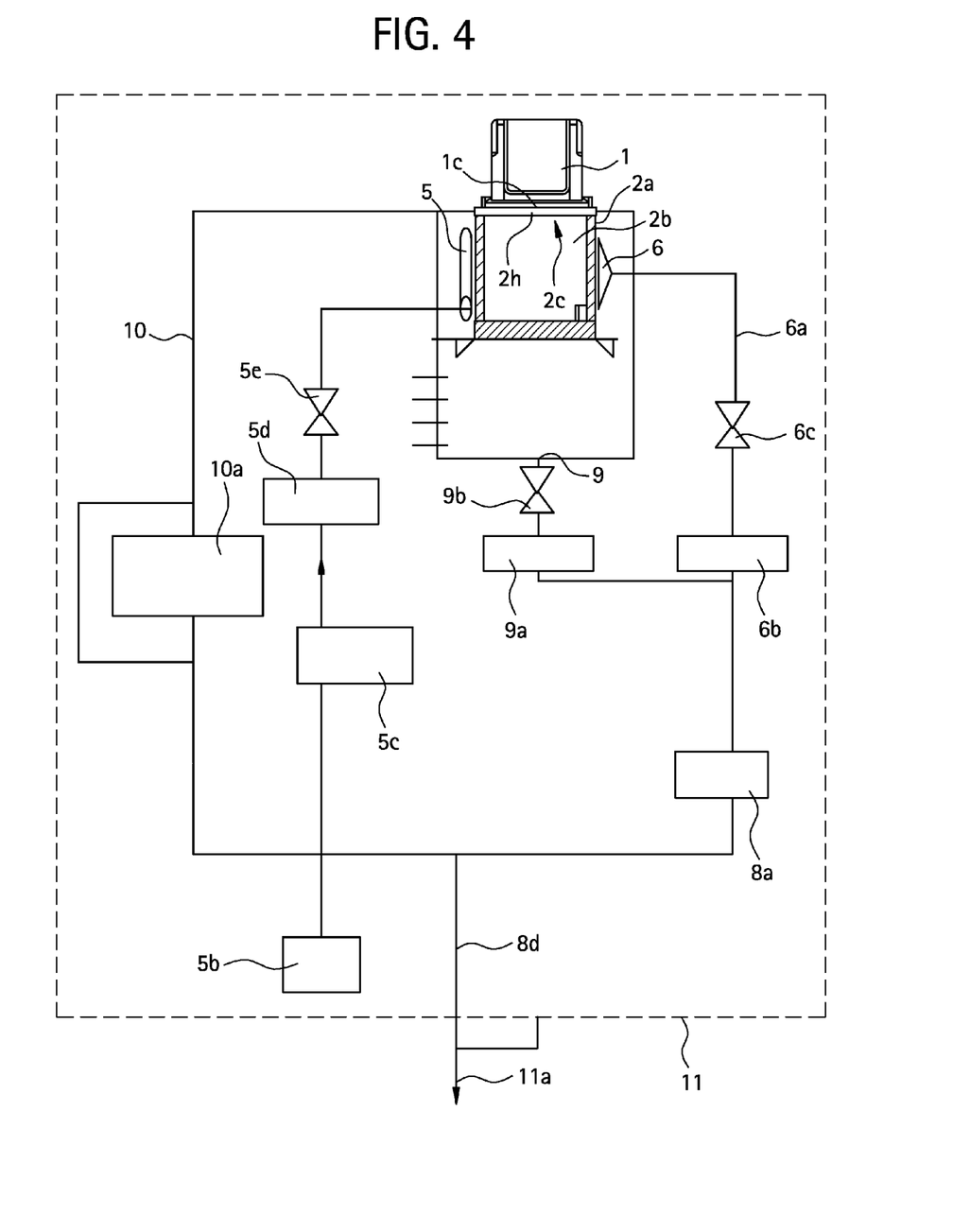
FIG. 4 shows another embodiment in which the device of the invention makes use of the general suction of the clean room for exhausting the purge gas.

In a second embodiment that is more advantageous, and that is shown in FIG. 4, the general suction of the clean room is used for exhausting the purge gas.

In this embodiment, the device of the invention is placed in the clean room, represented by dashed-line rectangle given reference numeral 11. In conventional manner, the clean room 11 has a suction pipe 11a, itself connected to the air treatment means of the clean room.

In the embodiment of FIG. 4, there can be seen the same essential elements of the device as in the embodiment of FIG. 3, and these elements are identified by the same numerical references. In particular, the structure of the purge station 2 is identical, as are the means 5, 5b, 5c, 5d, and 5e for injecting and distributing a purge gas, and the means 6, 6a, 6b, 6c, 9, 9a, and 8a for collecting and exhausting the purge gas.

The exhaust pipe 8d is then connected to the suction pipe 11a of the clean room 11.

There is no need to provide pump means 8b and 8c in series with the pumped gas analysis means 10a, since the suction provided by the suction pipe 11a is sufficient.

Figure 5:
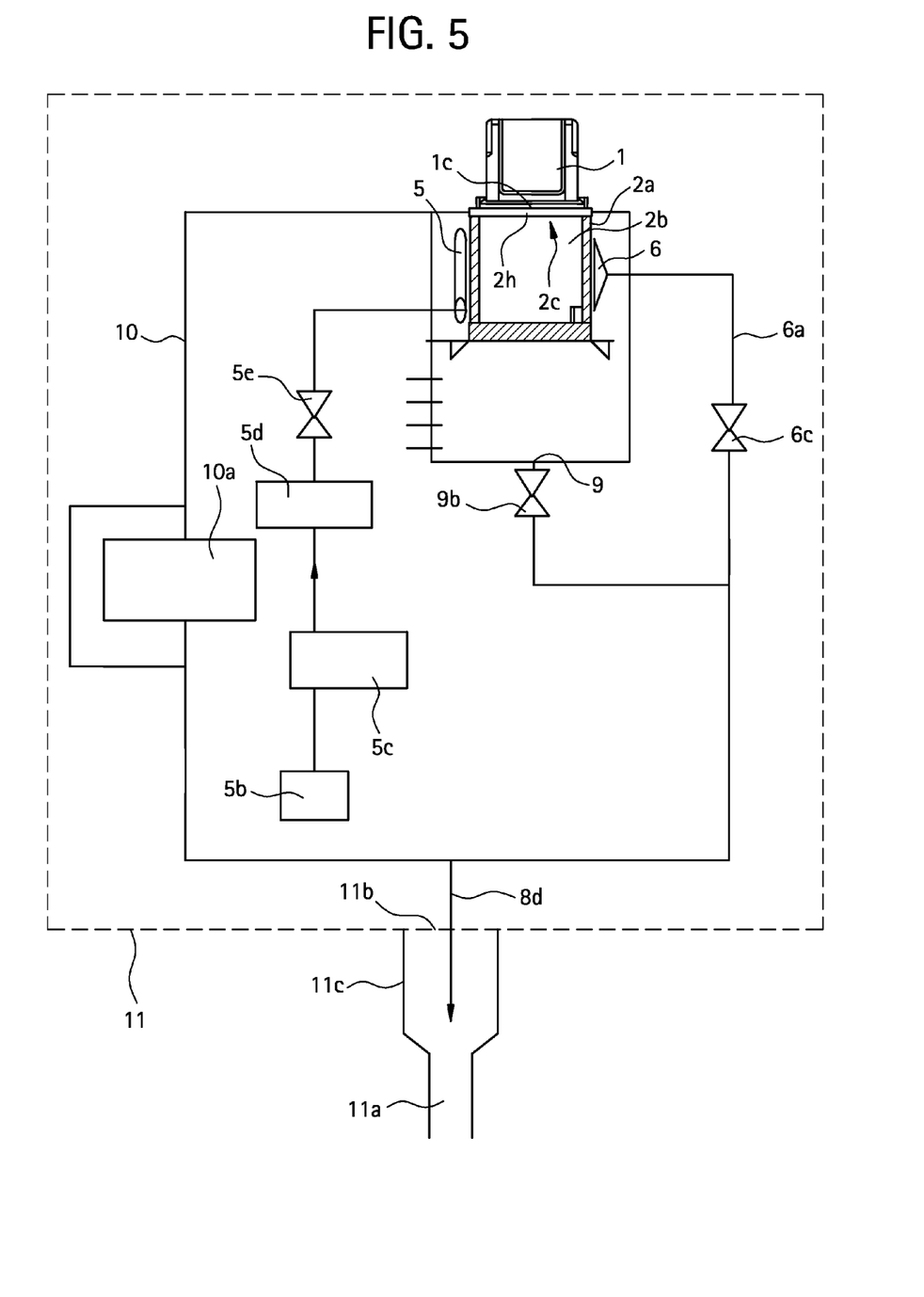
FIG. 5 shows a preferred embodiment in which the device of the invention uses the general suction of the clean room while avoiding applying suction to the purge volume.

In a preferred embodiment, as shown in FIG. 5, the general suction of the clean room is used likewise for collecting the purge gas and for providing purging. In the embodiment of FIG. 5, the same essential elements are to be found as in the embodiment of FIG. 4, and these essential elements are identified by the same numerical references.

Thus, there can be seen the same structure for the purge station 2, the same means 5, 5b, 5c, 5d, and 5e for diffusing the purge gas, the same means 6, 6a, 6c, 9, and 9b for collecting the purge gas, and the same gas analysis means 10a together with an exhaust pipe 8d.

A first difference lies in the way in which the pipe 8d is connected to the suction pipe 11a of the clean room 11: in this case, the exhaust pipe 8d leads in non-sealed manner to the inlet 11b of an outlet collector 11c, said inlet 11b itself being wide open to the clean room 11, with the outlet from the outlet collector 11c being connected to the suction pipe 11a of the clean room 11. As a result, the two pipes 8d and 11a are not connected together in leaktight manner, which makes it possible to ensure that the purge volume is never subjected to reduced pressure, i. e. that it always remains at a pressure close to atmospheric pressure. The absence of suction therein serves to avoid any damage to the wall of the mini-environment pod 1. The disposition shown in FIG. 5 also makes it possible to purge the mini-environment pod itself.

A second difference lies in the fact that no pump is required, neither in the pipe 6a, nor in the pipe 10, as can be seen in FIG. 5.

In use, it is advantageous to proceed in the manner described below.

The leaktight purge compartment 2b is initially filled with nitrogen prior to the mini-environment pod 1 being coupled thereto and opened, and prior to the stack 3 of substrate wafers being lowered therein, with this being for the purpose of improving purging.

The mini-environment pod is placed on the purge station 2 and is connected to the purge station via its under-surface. The handler means 4 lowers the bottom wall 1c, thereby opening the inside space of the mini-environment pod 1 so as to communicate with the leaktight purge compartment 2b. As the handler means 4 moves downwards, it lowers the stack 3 of substrate wafers until the stack is fully contained inside the leaktight purge compartment 2b. Simultaneously, nitrogen is introduced via the distributor column 5, and nitrogen is sucked out via the collector means 6.

While the stack 3 of substrate wafers is moving downwards, the gas such as air that was initially contained in the mini-environment pod 1 and that moves down via the transfer passage 2c is diluted little. It is then advantageous to analyze the gas by means of the gas analyzer 10a, e. g. an ion mobility spectrometer (IMS), or by means of a surface acoustic wave (SAW) gas concentration sensor on a piezoelectric material.

This serves to monitor the atmosphere inside the mini-environment pod 1 and enables the control means 100 to record variations therein. It is thus possible to keep a record of how the quality of the atmosphere in the mini-environment pod 1 varies.

It is also possible to modulate the frequency and the duration of nitrogen injections.

Purging the stack 3 of substrate wafers requires a duration lying in the range 1 min to 5 min, depending on the rate at which purge gas is injected, and on the expected level of purging. Thereafter, the stack 3 of substrate wafers is raised into the mini-environment pod 1. The mini-environment pod 1 can then be lifted off the purge station 2. Purge gas continues to be injected into the purge station 2 for a further duration of 5 min to 10 min in order to empty it of any residual air prior to fitting another mini-environment pod 1 thereof.

The control device 100 implements the most appropriate and most effective purging speed for ensuring that purging is effective without leading to any additional contamination that might arise from a flow rate that is too great and from the friction that would result therefrom against the surfaces of the substrates to be treated.

Too fast a speed can be detected by the gas analyzer means 10a at the outlet in the purge gas treatment device 7.

The device of the invention makes it possible to implement purging much more effectively and quickly than is possible in prior art devices, thereby encouraging the use of mini-environment pods such as SMIF pods in microelectronic processes.

Figure 9:
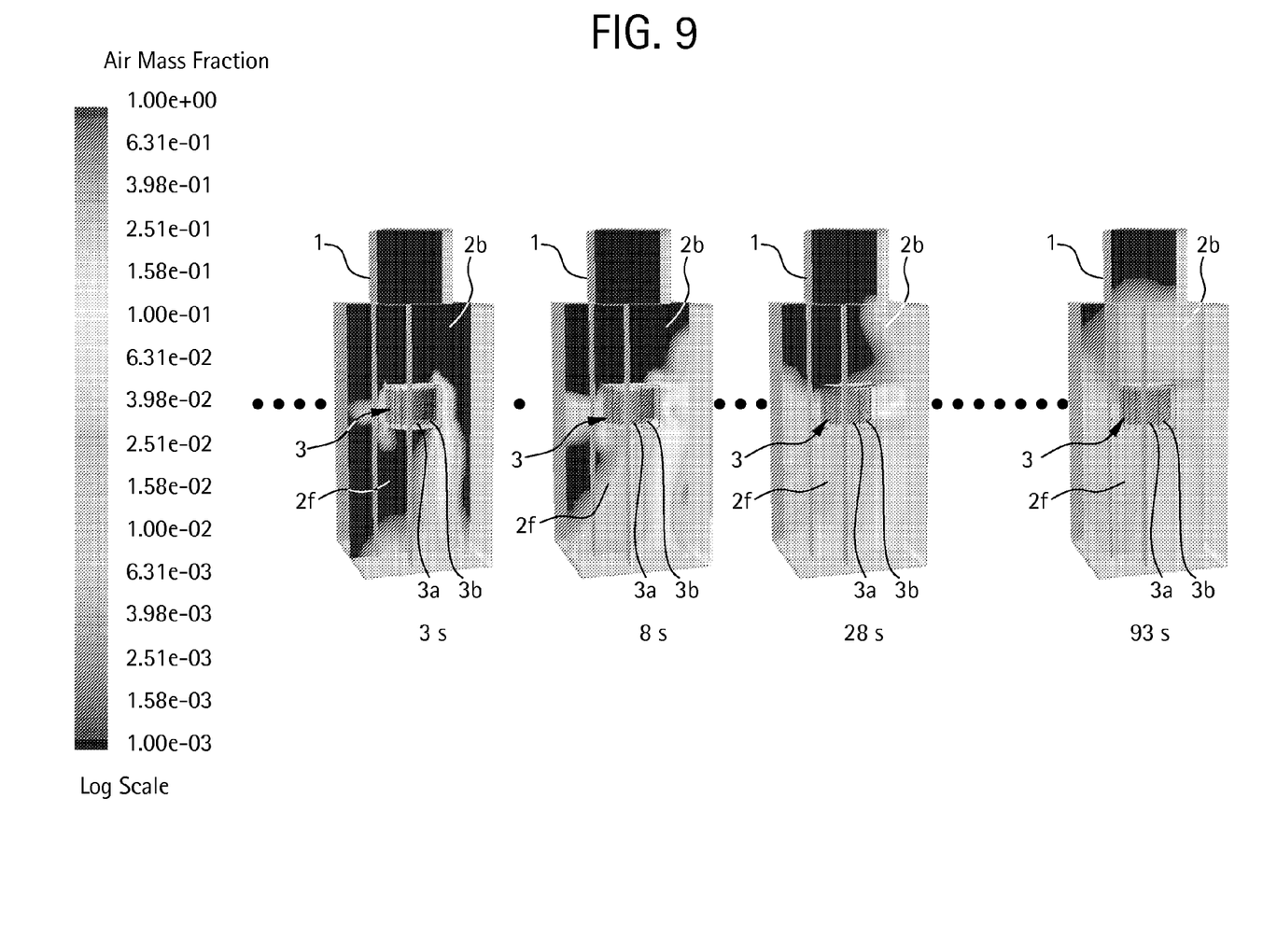
FIG. 9 shows how the concentration of a mixture of air and nitrogen varies while using lateral diffusion of nitrogen to purge the air with nitrogen in a purge station of the invention.

FIG. 9 shows how the residual concentration of air varies while purging in a purge station of the invention, using nitrogen. This figure was obtained by simulation, and shows the mini-environment pod 1 associated with a leaktight purge compartment 2b containing the stack 3 of substrate wafers. The gray scale represents the concentration of air in the various zones. Going from left to right, the four diagrams show how purging varies after 3 seconds, 8 seconds, 28 seconds, and 93 seconds. A flow of pure nitrogen is diffused into the stack 3 of substrate wafers from left to right, and it is extracted from the right.

After 3 seconds, almost pure air still occupies the right-hand zone 3a and the extreme right-hand zone 3b, while an air-rich mixture flows downwards from the right-hand end of the stack 3 of substrate wafers.

After 8 seconds, almost pure air is to be found only in the extreme right zone 3b.

After 28 seconds, the concentration of air in the extreme right zone 3b is of the order of $5\times10^{-2}$ while it is less than $10^{-2}$ in the remainder of the stack 3 of substrate wafers. Air concentration of about $5\times10^{-2}$ to $10^{-1}$ also persists in the right-hand portion of the bottom reserve volume 2f.

After 93 seconds, the concentration of air is less than $10^{-2}$ throughout the volume of the stack 3 of substrate wafers. Residual air at a concentration of about $5\times10^{-2}$ remains only in the bottom reserve volume 2f, and it can be seen that the presence of the bottom reserve volume 2f significantly reduces the residual concentration of air in the top zone of the leaktight purge compartment 2b that contains the stack 3 of substrate wafers.

The present invention is not limited to the embodiments described explicitly above, but includes the various generalizations and variants that are within the competence of the person skilled in the art.

What is claimed is:

1. A device for controlling and reducing contamination of a stack of disjoint substrate wafers in a mini-environment pod having a leakproof peripheral wall provided with a closable access passage for introducing and withdrawing the stack wherein the device further comprises a purge station in combination with said pod, said purge station comprising:
    a leaktight purge compartment dimensioned to receive and contain the stack;
    a closable transfer passage and means for selective leaktight coupling of the closable access passage to the closable transfer passage;
    handler means for moving the stack between the mini-environment pod and the leaktight purge compartment;
    diffuser means adapted to diffuse a purge gas laterally towards edges of the disjoint substrate wafers in the stack parallel to main faces thereof; and
    collector means disposed to collect the diffused flow of purge gas remote from the diffuser means after passing between the disjoint substrate wafers of the stack, wherein said stack is purged inside said leaktight purge environment while the mini-environment pod is simultaneously purged.

2. A device according to claim 1, characterized in that the diffuser means comprises one or more distributor columns having respective continuous longitudinal slots of a width configured to pass the purge gas radially.

3. A device according to claim 1, characterized in that the diffuser means comprises one or more distributor columns each having a series of holes distributed along a generator line of the distributor column.

4. A device according to claim 1, characterized in that the diffuser means comprises a rectangular vertical grid placed laterally facing the stack.

5. A device according to claim 1, characterized in that the leaktight purge compartment includes a bottom reserve volume occupying the space beneath the stack while purging is taking place.

6. A device according to claim 1, characterized in that the mini-environment pod is a pod having a standardized mechanical interface (SMIF) including a bottom wall that closes the closable access passage and that is movable vertically while supporting the stack,
    the purge station having a top face provided with the closable transfer passage and provided with leaktight coupling means for coupling around the access passage to allow the bottom wall to move vertically together with the stack into the inside of the leaktight purge compartment; and
    the handler means comprises an elevator housed in the leaktight purge compartment and adapted to support the bottom wall of the mini-environment pod together with the stack to move the disjoint substrate wafers between the mini-environment pod and the leaktight purge compartment.

7. A device according to claim 6, characterized in that the purge station further comprises a purge gas treatment device connected to the inside space of the leaktight purge compartment to collect the purge gases.

8. A device according to claim 7, characterized in that the purge gas treatment device is connected:
    to the collector device to receive the purge gas after the purge gas has passed between the wafers of the stack;
    to the bottom reserve volume to receive the gas confined in the bottom reserve volume; and
    to the top zone of the leaktight purge compartment in the vicinity of the closable transfer passage.

9. A device according to claim 7, further comprising pump means for sucking the purge gas away from the leaktight purge compartment and for delivering the purge gas into an exhaust pipe.

10. A device according to claim 9, characterized in that the exhaust pipe is connected to the suction pipe of a clean room.

11. A device according to claim 9, characterized in that the exhaust pipe delivers in non-sealed manner to the inlet of an outlet collector, said inlet being open to the clean room, and the outlet from the outlet collector being connected to the suction pipe of the clean room.

12. A device according to claim 9, further comprising means for analyzing the pumped gas.

13. A device according to claim 12, characterized in that the means for analyzing the pumped gas comprises an ion mobility spectrometer (IMS).

14. A device for controlling contamination of a stack of wafers in a pod having a leakproof peripheral wall with a closable access passage for introducing and withdrawing the stack, including a purge station in combination with said pod, said purge station comprising:
    a leaktight purge compartment that receives and contains the stack;
    a closable transfer passage and device that selectively and leaktight couples the closable access passage to the closable transfer passage;
    a handler that moves the stack between the pod and the leaktight purge compartment;
    a diffuser that diffuses a purge gas laterally towards edges of the wafers parallel to main faces thereof; and a collector that collects the diffused flow of purge gas remote from the diffuser after passing between the wafers, wherein said stack is purged inside said leaktight purge environment simultaneously with the pod.

15. The device of claim 14, wherein the pod has a standardized mechanical interface (SMIF) including a bottom wall that closes the closable access passage and moves vertically while supporting the stack, the purge station has a top face provided with the closable transfer passage and provided with leaktight coupler that couples around the access passage and allows the bottom wall to move vertically together with the stack into the inside of the leaktight purge compartment; and the handler comprises an elevator housed in the leaktight purge compartment and adapted to support the bottom wall of the pod with the stack to move the wafers between the pod and the leaktight purge compartment.

16. The device of claim 15, wherein the purge station further comprises a purge gas treatment device that is connected to the inside space of the leaktight purge compartment and collects the purge gases.

17. The device of claim 16, wherein the purge gas treatment device is connected:

to the collector device to receive the purge gas after the purge gas has passed between the wafers;

to the bottom reserve volume to receive the gas confined in the bottom reserve volume; and to the top zone of the leaktight purge compartment in the vicinity of the closable transfer passage.

18. The device of claim 16, further comprising a pump that sucks the purge gas away from the leaktight purge compartment and delivers the purge gas into an exhaust pipe.

19. A method for controlling and reducing contamination of a stack of disjoint substrate wafers in a mini-environment pod having a leakproof peripheral wall provided with a closable access passage for introducing and withdrawing the stack, in combination with a purge station in combination with said pod, said method comprising, in said purge station:

dimensioning a leaktight purge compartment to receive and contain the stack;

selectively leaktight coupling the closable access passage to a closable transfer passage;

moving the stack between the mini-environment pod and the leaktight purge compartment;

diffusing a purge gas laterally towards edges of the disjoint substrate wafers in the stack parallel to main faces thereof; and collecting the diffused flow of purge gas remote after said diffusing and after passing between the disjoint substrate wafers of the stack, wherein said stack is purged inside said leaktight purge environment while the mini-environment pod is simultaneously purged.

20. The method of claim 19, further comprising collecting the purge gases via a purge gas treatment device connected to the inside space of the leaktight purge compartment, wherein the purge gas treatment device is connected to a collector to receive the purge gas after the purge gas has passed between the wafers of the stack, to a bottom reserve volume to receive the gas confined in the bottom reserve volume; and to a top zone of the leaktight purge compartment in the vicinity of the closable transfer passage.

* * * * *